United States Patent [19]

Petrosky et al.

[11] 4,229,697
[45] Oct. 21, 1980

[54] MAGNETOMETER INSTRUMENTATION WITH DIGITALLY CONTROLLED RANGE CHANGING

[75] Inventors: Kenneth J. Petrosky, Glen Burnie; James H. Wilson, Severna Park, both of Md.

[73] Assignee: Westinghouse Electric Corp., Pittsburgh, Pa.

[21] Appl. No.: 962,508

[22] Filed: Nov. 20, 1978

[51] Int. Cl.² .................. G01R 15/08; G01R 33/00; G01V 3/00
[52] U.S. Cl. .................................. 324/244; 324/115; 324/345
[58] Field of Search .................. 324/114, 115, 123 R, 324/244–259, 345, 331, 99 D

[56] References Cited

U.S. PATENT DOCUMENTS

| 3,159,787 | 12/1964 | Sexton et al. | 324/123 R X |
|---|---|---|---|
| 3,167,665 | 1/1965 | Godby et al. | 324/254 X |
| 3,187,323 | 6/1965 | Flood et al. | 324/115 X |
| 3,582,777 | 6/1971 | Wunderman | 324/115 X |
| 3,679,969 | 7/1972 | Fussell | 324/244 |
| 3,697,870 | 10/1972 | Brenner | 324/244 |
| 3,701,007 | 10/1972 | Schad | 324/247 |
| 3,958,178 | 5/1976 | Mueller et al. | 324/115 |

Primary Examiner—Gerard R. Strecker
Attorney, Agent, or Firm—D. Schron

[57] ABSTRACT

Magnetometer instrumentation which processes the signals from an array of magnetometer assemblies wherein the need for multiple sets of motor driven resistors to change the gain of the signal processing channels is eliminated by the provision of an arrangement which utilizes multiplying digital-to-analog converters that are directly commandable by digital signals.

14 Claims, 6 Drawing Figures

MAGNETOMETER INSTRUMENTATION WITH DIGITALLY CONTROLLED RANGE CHANGING

BACKGROUND OF THE INVENTION

1. Field of the Invention

The invention in general relates to magnetometer signal processing apparatus and particularly to apparatus for obtaining the magnetic signature of a marine vessel.

2. Description of the Prior Art

During the construction of a steel ship, many parts become magnetized and retain the magnetization. Other parts become magnetized by induction in the earth's magnetic field. The ship then acquires a magnetization which causes deviation of the magnetic compass and which may trigger magnetic mines or other explosive devices when the ship passes near them.

Neutralization of the strength of the magnetic field of the ship is accomplished by means of suitably arranged electric coils permanently installed at various locations in the ship. These coils are known as degaussing coils and the current provided to the degaussing coils is adjusted so as to try to maintain magnetic field neutrality. Thus, the ship will appear "invisible" to a magnetic mine.

In order to have some idea of what currents to provide the degaussing coils, the "magnetic signature" of the ship must be obtained. One method of obtaining this signature, or ship's magnetic variation, is to relatively pass the ship over an array of magnetometer devices, the output signals of which are affected by the passage of the ship past the array. A signal processing circuit is generally provided for processing a respective magnetometer output signal and in one widely used system, the magnetometer is of the type which provides an output signal indicative of only a change in the earth's magnetic field at the location, as opposed to the absolute value of it. This is accomplished by means of a compensating coil which is provided with current to counteract the earth's magnetic field so as to null the instrument.

The signal processing apparatus generally includes a meter for each respective magnetometer signal processing circuit, in addition to a recording means for making a permanent record of the magnetic deviations.

The degree of magnetization of the ship, and accordingly, the magnitude of the signal in each signal processing channel, is a function of the constructional materials utilized in the ship. For example, a wooden or aluminum ship might produce a minute change; whereas a completely steel or iron ship might send the readout instruments off-scale. Accordingly, to accommodate for these variations, the signal processing channels include means for varying the gains thereof, and a typical system might have ten or more gain ranges so that, for example, the maximum deviation caused by a wooden vessel will be a full scale movement, with one gain range setting, as would a steel ship with another gain range setting.

To set these various gain ranges, the signal processing channels include a plurality of sets of resistors having different values in accordance with the desired gain. The apparatus requires a relatively large amount of space to accommodate all of the necessary resistor sets, and in addition, a plurality of motor-driven rotary switches is required so that an operator may change the gain range without the requirement for manual intervention for all of the sets of resistors. In addition to the space requirement for these motor-driven switches, there is an additional power requirement and the objection of mechanical wear.

SUMMARY OF THE INVENTION

The present invention eliminates the need for motor-driven rotary switches and the mechanical insertion of various sets of resistors for varying the gain range of the magnetometer signal processing circuitry.

The signal processing circuit for each magnetometer assembly includes a signal processing channel having first and second amplifier means. The first amplifier means is connected to receive the magnetometer output signal and serves as a preamplifier, capable of changing its gain. The second amplifier means is connected to receive the output signal of the first amplifier means and is additionally connected to receive a digital input signal and is operative to modify the first amplifier signal as a function of the digital input signal. A digital memory means for providing the digital input signal includes a plurality of addressable storage locations and means are provided for addressing specific ones of the memory locations in the memory means to provide different digital input signals in accordance with a particular desired gain range of the signal processing channel.

The signal processing circuitry additionally includes circuit means for supplying a compensation coil of the magnetometer assembly with a particular current to create a magnetic field in opposition with the earth's magnetic field at the assembly location so as to null the detector.

Thus, by a simple expedient of a manual gain range selection, the gains of all of the signal processing channel may be changed. In addition, the apparatus is particularly well adapted to be controlled by a digital computer, if desired.

DESCRIPTION OF THE PREFERRED EMBODIMENT

Figure 1:
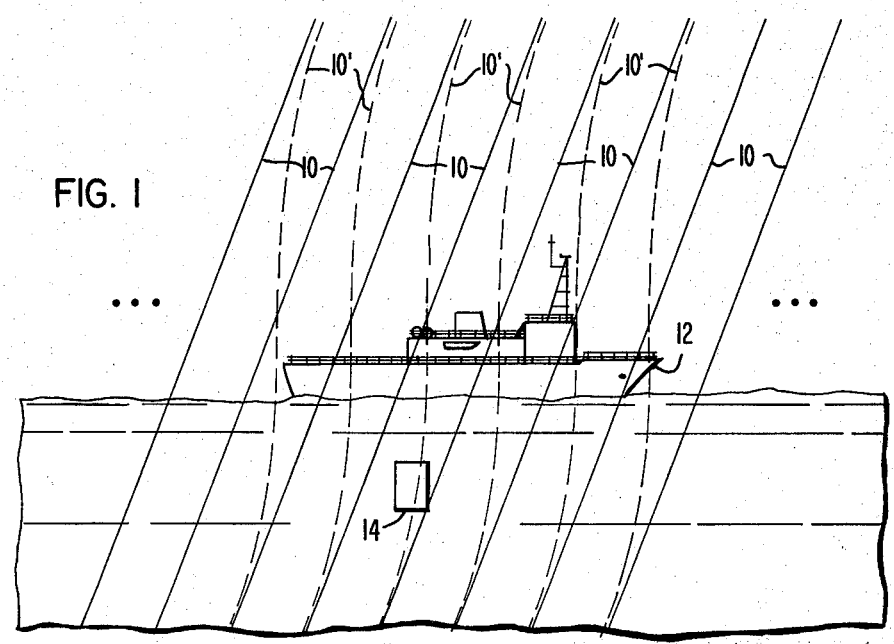
FIG. 1 illustrates a surface vessel within the earth's magnetic field.

In FIG. 1, the earth's magnetic field, as represented by solid lines 10, may be distorted, as indicated by dotted lines 10' by the presence of a vessel, such as surface ship 12. A magnetic detector 14 is in a position to detect this change in the earth's magnetic field, such detector, for example, being a magnetometer assembly. Since the largest component of the earth's field is vertical, many magnetometer assemblies function to detect only the change in the vertical component of the field; however, other assemblies are available which detect both vertical and horizontal changes.

Figure 2:
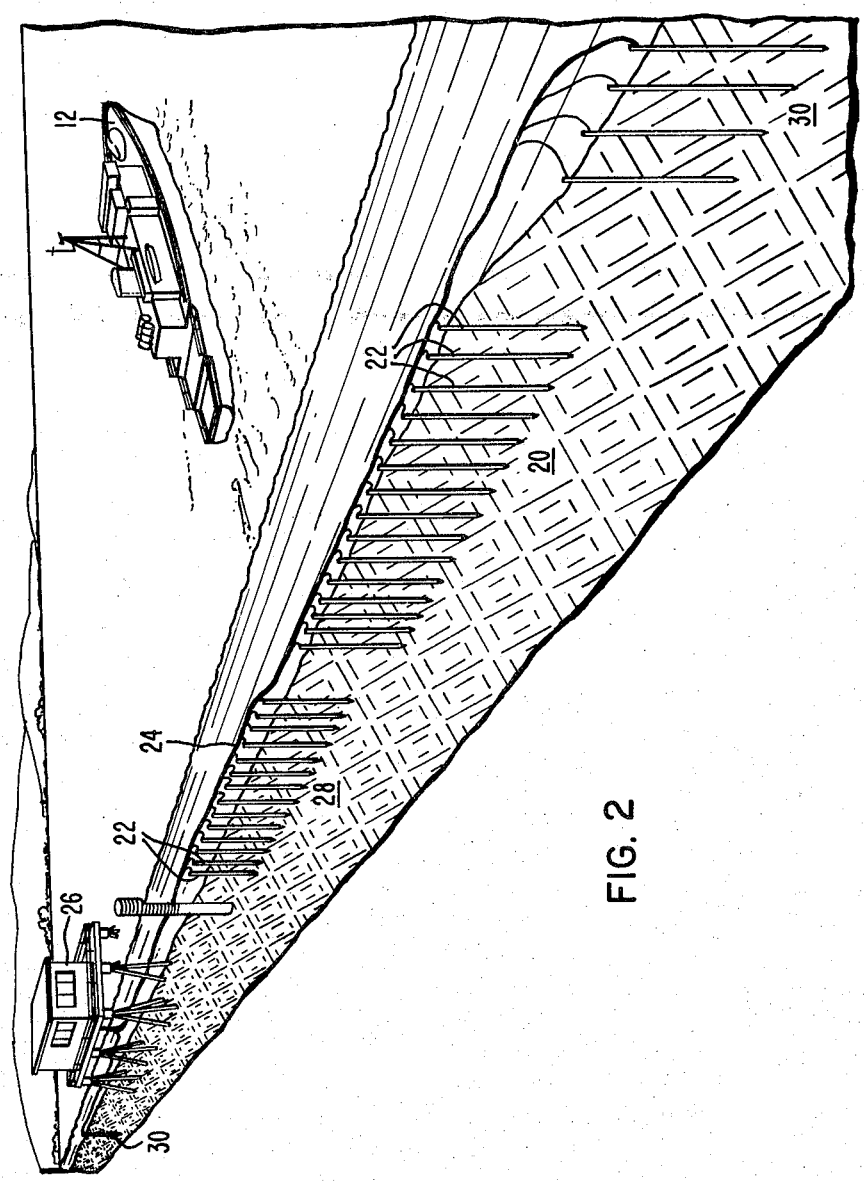
FIG. 2 illustrates a test range wherein a surface vessel relatively moves past an array of magnetometer assemblies.

If the ship 12 wishes to pass the magnetometer assembly undetected or unmolested, the degaussing coils carried by the ship must be operative to supply an opposing magnetic field so that the result will be, in effect, no net change in the earth's magnetic field. To determine what effect the ship will have on the earth's magnetic field due to its own magnetism, the magnetic signature of the ship is obtained by having the ship relatively move past an array of magnetometer assemblies, as illustrated in FIG. 2. In FIG. 2, the ship 12 has just passed over an array 20 of magnetometer assemblies 22. The output signals from these respective assemblies are provided by means of cables 24 to a monitoring station 26.

Generally, other arrays, such as array 28 and array 30, may be provided at the test site with the magnetometer assemblies of these arrays being positioned at different respective heights. The present invention, however, will be described with respect to only one such array, array 20, although the principles discussed are applicable to each of the arrays utilized.

As is customarily done, and as will be explained, a separate magnetometer assembly 30 is provided away from the other arrays of magnetometers to serve as a monitor of the earth's magnetic field to assist in the nulling of the instrumentation. In addition, in test locations where the water level varies, there is generally provided a tide or water level monitor 32, the output signal of which is utilized to normalize the results obtained.

Figure 3:
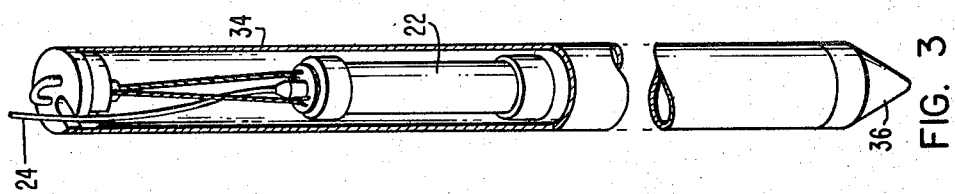
FIG. 3 is a view with a portion cut away of an in-place magnetometer assembly.

A typical magnetometer assembly is illustrated in FIG. 3. The assembly 22 is positioned within a protective tube 34 made of non-magnetic material, such as a fiberglass or plastic. The protective tube 34 has a pointed end section 36 to assist during the insertion of the tube into the bed of the body of water. One type of commercially available magnetometer assembly includes a magnetometer detector and a compensation coil which is provided with current to generate a magnetic field to counteract the earth's magnetic field at that location so that the detector in the absence of a magnetic disturbance will not provide an output signal. The signals that are provided during the presence of a magnetic disturbance and the compensation coil current are conducted to and from the monitoring station by means of the cable 24.

Figure 4:
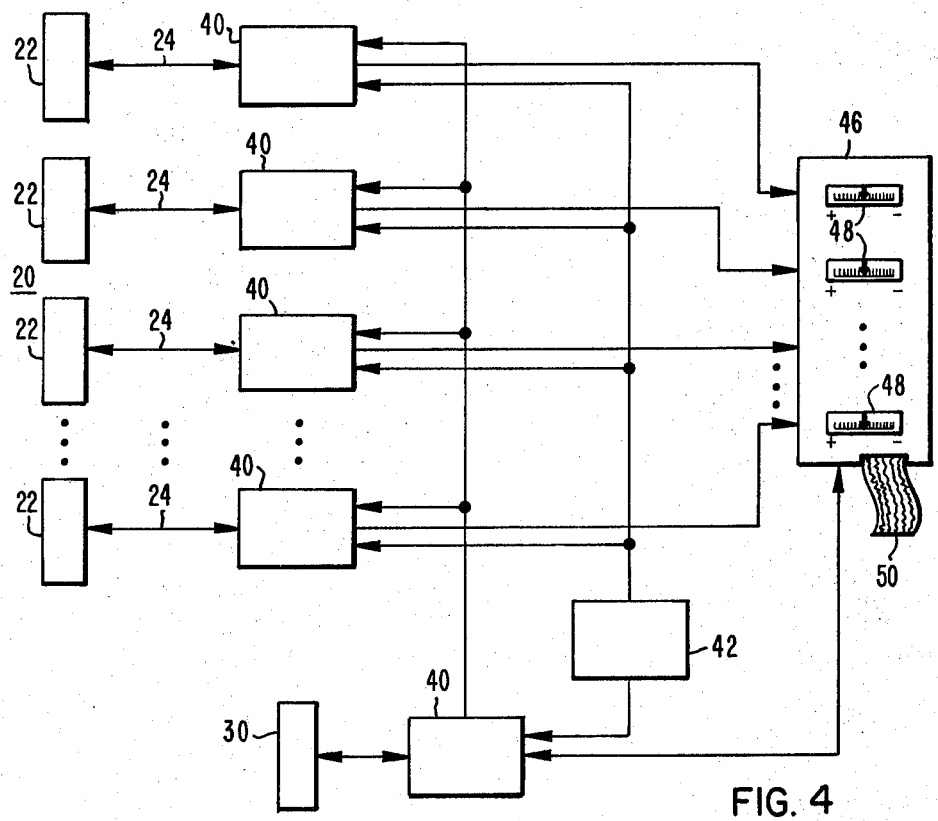
FIG. 4 is a block diagram of a magnetometer assembly array interconnected with respective signal processing circuits.
Figure 5:
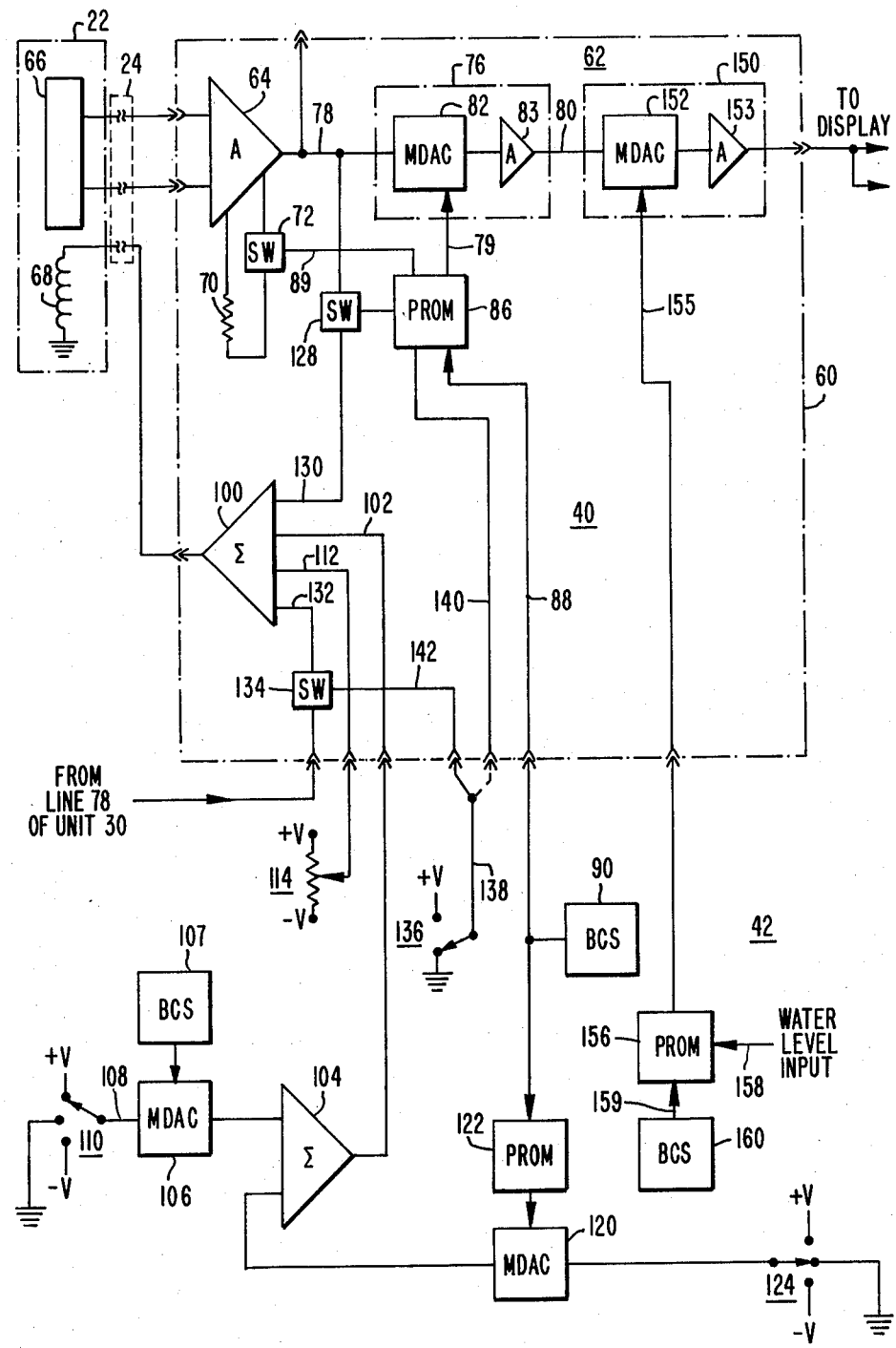
FIG. 5 is a block diagram of one embodiment of the present invention.

FIG. 4 illustrates a block diagram, and it is seen that each of the magnetometer assemblies 22, as well as the isolated magnetometer assembly 30, is connected to a respective signal processing circuit 40, all under control of a central control circuit 42. During operation, the signal processing circuits 40 provide respective output signals to a display 46, which may include a plurality of meters 48, one for each magnetometer assembly, and each being operable to show a positive or negative deviation from a null position. For a permanent record, a strip chart recorder 50 is provided with a plurality of recording channels to accommodate the magnetometer assembly output signals. A typical signal processing circuit 40 in addition to the central control circuit 42 is shown in more detail in FIG. 5, to which reference is now made.

The components of the signal processing circuit 40 are positioned on a printed wire assembly board 60. The signal processing circuit includes a signal processing channel 62 having a first amplifier means in the form of variable gain preamplifier 64 connected to receive the output signal from the magnetometer assembly 22. The assembly itself includes a magnetometer detector 66 and a compensation coil 68.

The gain of the variable gain preamplifier may be changed with the insertion of a resistor 70 in its feedback circuit, with the insertion of the resistor being controlled by switch means 72, preferably of the electronic variety, such as a metal oxide semiconductor (MOS) switch.

Signal processing channel 62 additionally includes second amplifier means 76 with this amplifier section being of the type to receive, on line 78, the output of amplifier 64 in addition to a digital input signal on line 79 to provide an output signal on line 80, which is a function of the digital input signal. With this arrangement, the gain within the signal processing channel may be varied to any desired range by providing predetermined digital word inputs. The implementation of the amplifier stage 76 which varies the gain of the signal processing channel in accordance with an input digital word, is accomplished, in one embodiment, with the inclusion of a multiplying digital-to-analog converter (MDAC) 82, a device that changes an input reference voltage to a current output proportional to the reference voltage times the digital word provided to the MDAC. A buffer amplifier 83 then converts the current signal back to a voltage signal. Such MDACs are commercially available devices, one example of which is sold by Analog Devices of Norwood, MA, under the designation AD7520 or AD7521.

The digital word supplied to MDAC 82 on line 79 is provided by a digital memory means having a plurality of addressable storage locations, one example of which is a commercially available programmable read-only memory (PROM) 86. An addressing signal on line 88 into the PROM 86 addresses a particular storage location to output its digital word to MDAC 82. Additionally, PROM 86 is operable to supply a control signal on line 89 to switch 72 to cut-in or cut-out resistor 70 from the variable gain amplifier circuit. In this manner, the gain of the signal processing channel may be varied to accommodate a multitude of gain ranges by the simple provision of an address word indicative of the range desired. This address word may be provided by a binary coded switch 90 operatively connected with line 88 on the printed wire assembly board 60.

Driver circuit 100 is provided to supply the compensation coil 68 with a particular current to null the apparatus. Driver circuit 100 has a number of input signals, one of which on line 102 provides a coarse compensation signal. This coarse compensation signal is provided to each of the signal processing circuits from the central control circuit 42, and more particularly, from a summing amplifier 104, which receives as one input thereto a signal from MDAC 106. MDAC 106 is similar to MDAC 82 in structure and receives an input digital word from a binary coded switch 107. The reference voltage for MDAC 106 appears on line 108 and is chosen by means of switch arrangement 110 to be either a positive or negative voltage $+V$ or $-V$, depending upon whether the earth's magnetic field is positive or negative, a function of the apparatus location. In its inoperative condition, the switch would be connected to ground potential. Thus, by the expedient utilization of a simple binary coded switch, various ranges of voltages may be provided to the driver circuit 100 for initial compensation. A fine compensation signal is provided to driver circuit 100 on line 112 by means of the potentiometer arrangement 114.

Once having adjusted the apparatus such that the output meter reading is zero in the absence of any ship, it is generally desirable to see if the meter will deflect full scale for the gain range selected if a magnetic disturbance of that magnitude were encountered. In the present invention, this function is accomplished with the provision of an MDAC 120 which provides an output signal through summing amplifier 104 to the driver circuit 100 to simulate that particular magnetic disturbance. The value of signal provided is governed by a second PROM 122 which is addressed by the very same signal that addresses PROM 86, the signal provided by binary coded switch 90. That is, the gain of signal processing channel 62 is governed by the outputs of PROM 86, which in turn, is governed by the desired gain, as indicated by binary coded switch 90. The set gain is communicated to MDAC 120 by means of PROM 122, which modifies an input reference signal ±V chosen by switch arrangement 124 manually thrown to the +V setting to get a full scale positive deflection and to the −V setting to get a full scale negative deflection. Thereafter, switch 124 is maintained in a neutral position connected to ground potential.

As described herein, the gain of signal processing channel 62 is digitally controlled by means of PROM 86. A coarse gain variation is obtained by means of switching resistor 70 in and out of circuit, a typical range gain being 20 to 1, by way of example. A finer adjustment of the gain is obtained by the MDAC controlled amplifier 76. A further variation of gain, under control of PROM 86 is provided by means of PROM controlled MOS switch 128 which connects the output signal of amplifier 64, appearing on line 78, to input line 130 of driver circuit 100. This is a common feedback technique in such apparatus; however, in the present invention, it is under the direct control of the digital circuitry.

A fourth input to driver circuit 100 appears on line 132 and is the output signal provided by amplifier 64 of the isolated magnetometer assembly 30. The arrangement provides an additional fine compensation due to variations in the earth's magnetic field.

The application of this signal is governed by MOS switch 134 which, for all units 22, would be wired to binary signal source 136 consisting of a selectable ground (0) or +V (1) signal. Line 138 from the source would be connected to line 140 of the printed wire assembly board for magnetometer assembly 30, and would be connected to line 142 for all other magnetometer assemblies. When connected to line 140, as indicated by the dotted line, the input signal thus provided to PROM 86 would command it to disregard or override any input command on line 88 so as to maintain the gain of signal processing channel 62 at a constant value even though the gain range of the other units is being commanded to different other values. During initial set-up and adjustment, the binary signal source 136 is switched to a positive voltage to cause switch 134 to open line 132. After the initial adjustment, switch 134 is thereafter commanded to provide the signal from line 78 of unit 30 to the input of driver circuit 100.

In the testing of a vessel to obtain its magnetic signature, the same reading should occur for a ship whether passing over the magnetometer assembly array at low tide or at high tide. The readings are, however, affected by the proximity of the vessel to the array. In order to normalize the readings therefore, the signal processing channel includes an extra stage of amplification to vary the gain in accordance with the water level. Conventionally, this is normally done with servo driven non-linear potentiometers which have the same disadvantages as the previously mentioned servodriven resistor networks.

In the present arrangement, this normalization function is accomplished with the provision of amplifier stage 150 similar to amplifier stage 76 in the inclusion of an MDAC 152 and buffer amplifier 153. The signal in the signal processing channel is modified by the MDAC 152 as a function of the digital command on line 155 provided by a third PROM 156. An input signal on line 158 is indicative of the water level in the test area and this signal corresponds to a particular gain to be utilized, the indications of which are previously stored in the memory locations of PROM 156. Line 159 is an additional input to PROM 156 from binary coded switch 160 which selects a particular normalizing function.

Figure 6:
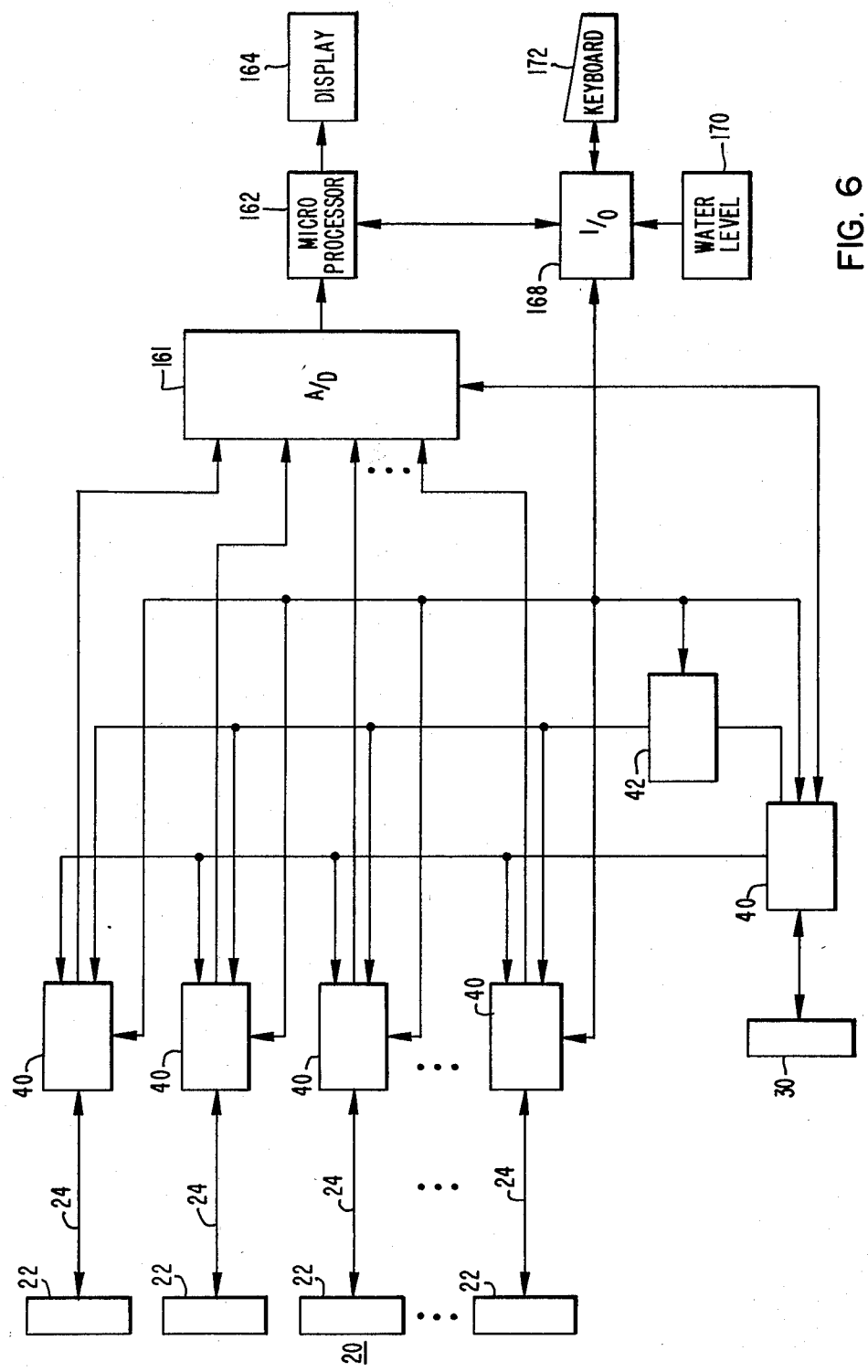
FIG. 6 illustrates the adaptability of the present invention to computer control.

With the arrangement of the present invention, operation may be achieved manually by operation of binary coded switches. This system, however, is particularly well adapted for computer control as indicated in FIG. 6. For such automatic operation, the apparatus includes an analog-to-digital converter 161 which receives the output signals from all of the signal processing circuits 40 where they are interpreted by microprocessor 162 and thereafter outputted on display 164. Microprocessor 162 also provides the necessary digital signals to the various PROMs by interaction through the input-output unit 168. The unit 170 provides a signal indicative of the water level and to provide for operator interfacing with the apparatus, keyboard 172 is provided.

Thus, the present invention accomplishes the obtaining of the magnetic signature of a vessel in a manner similar to the prior art systems utilizing arrays, gain changing, feedback and initializing, however, with apparatus which eliminates the need for mechanical switching of multiple sets of resistors and in a space the fraction of a size of the prior art equipment. The apparatus eases the job of troubleshooting and supplying spare parts and the system is directly connectable with a microprocessor or computer system for control and data processing.

We claim:

1. A magnetometer instrumentation for an array of magnetomer assemblies, each having a magnetometer detector and a compensation coil comprising:
   (a) a signal processing circuit for each said assembly and including a signal processing channel for processing the detector output signal;
   (b) said signal processing channel including first and second amplifier means;
   (c) said first amplifier means being operatively connected to receive said detector output signal and including means for changing the gain of said first amplifier means;
   (d) said second amplifier means being operatively connected to receive (i) the output signal of said first amplifier means and (ii) a digital input signal and being operative to modify said first amplifier signal as a function of said digital input signal;
   (e) first digital memory means for providing said digital input signal and having a plurality of addressable storage locations;
   (f) first means for addressing specific memory locations in said first digital memory means to provide specific ones of said digital input signals in accordance with a particular desired gain range of said signal processing channel; and (g) circuit means for supplying said compensation coil with a current to create a magnetic field in opposition with the earth's magnetic field at the assembly location so as to null said detector.

2. Apparatus according to claim 1 wherein:
(a) said first amplifier means includes resistor means and switch means for placing said resistor means into the circuit of said first amplifier means to change the gain thereof;
(b) said switch means being connected to said first digital memory means and being operable to open and close in accordance with control signals provided to it by said first digital memory means.

3. Apparatus according to claim 1 wherein:
(a) said second amplifier means includes a first multiplying digital-to-analog converter circuit for providing a current output signal as a function of (i) said output signal of said first amplifier means and (ii) said digital input signal, and further includes;
(b) a buffer amplifier for providing a voltage output signal in response to said current output signal of said multiplying digital-to-analog converter.

4. Apparatus according to claim 1 wherein said circuit means includes:
(a) a current driver circuit connected to supply said compensation coil with a compensating current signal;
(b) a first circuit device of the type which is operable to receive (i) an input reference signal and (ii) a digital input signal to provide an output signal as a function of said digital output signal;
(c) means for supplying said first circuit device with a reference signal, the polarity of which is dependent upon the location of the apparatus with respect to the earth's magnetic field;
(d) means for supplying said first circuit device with a second digital signal indicative of a desired coarse compensation value; and
(e) amplifier means for supplying the output signal of said first circuit device to said current driver circuit.

5. Apparatus according to claim 4 wherein:
(a) said first circuit device is a multiplying digital-to-analog converter.

6. Apparatus according to claim 4 which includes:
(a) a second circuit device of the type which is operable to receive (i) an input reference signal and (ii) a digital input signal to provide an output signal as a function of said digital output signal;
(b) means for supplying said second circuit device with a reference signal;
(c) second digital memory means having a plurality of digital storage locations for supplying various digital signals when so addressed;
(d) said second circuit means being connected to receive, as a second input, the digital signals provided by said second digital memory means;
(e) the output of said second circuit device being provided to said current driver circuit.

7. Apparatus according to claim 6 wherein:
(a) the output of said second circuit device is provided to said current driver circuit by means of said same amplifier means which receives the output signal of said first circuit device.

8. Apparatus according to claim 6 wherein:
(a) said second digital memory means is addressed by said same means for addressing which addresses said first digital memory means.

9. Apparatus according to claim 6 wherein:
(a) both said first and second circuit devices are multiplying digital-to-analog converters.

10. Apparatus according to claim 1 which includes:
(a) means for selectively supplying said second circuit device with positive or negative reference signals.

11. Apparatus according to claim 1 which includes:
(a) switch means for connecting the output signal of said first amplifier means to said circuit means and being under control of said first digital memory means.

12. Apparatus according to claim 1 which includes:
(a) a magnetometer assembly isolated from said array;
(b) the signal processing circuit components of said isolated assembly being identical to those of said array;
(c) means for supplying the output signal of said first amplifier means of the signal processing circuit of said isolated assembly to all of the circuit means of said array assemblies;
(d) said first digital memory means associated with said isolated assembly being non-responsive to said means for addressing so as not to change the gain in its signal processing channel when the remaining channels are so changed.

13. Apparatus according to claim 1 wherein:
(a) said array is positioned within a body of water subject to tidal variation;
(b) said signal processing channel includes third amplifier means being operatively connected to receive (i) the output signal of said second amplifier and (ii) a digital input signal and being operative to modify said second amplifier signal as a function of said digital input signal;
(c) third digital memory means for providing said said digital input signal to said third amplifier means and having a plurality of addressable storage locations;
(d) second means for addressing specific memory locations in said third digital memory means to provide specific ones of said digital input signals in accordance with said tidal variation.

14. Apparatus according to claim 13 wherein:
(a) said third amplifier means includes a fourth multiplying digital-to-analog converter circuit for providing a current output signal as a function of (i) said output signal of said second amplifier means and (ii) said digital input signal.

* * * * *